United States Patent [19]

Fong et al.

[11] Patent Number: 4,788,165
[45] Date of Patent: Nov. 29, 1988

[54] COPPER-EXUDING, BOROALUMINOSILICATE GLASSES

[75] Inventors: Gerald D. Fong, Beaver Dams; Sheryl L. Hultman, Corning, both of N.Y.

[73] Assignee: Corning Glass Works, Corning, N.Y.

[21] Appl. No.: 105,262

[22] Filed: Oct. 7, 1987

[51] Int. Cl.$^4$ .................................................. C03C 3/091
[52] U.S. Cl. .................................................. 501/66
[58] Field of Search .......................................... 501/66

[56] References Cited

U.S. PATENT DOCUMENTS

| | | | |
|---|---|---|---|
| 2,685,526 | 8/1954 | Lebino | 501/66 |
| 2,733,158 | 1/1956 | Tiede | 501/66 |
| 3,440,172 | 4/1969 | Albinak et al. | 501/66 |
| 3,451,579 | 6/1969 | Bishop | 501/7 |
| 3,459,569 | 8/1969 | Ellis | 501/7 |
| 3,468,646 | 9/1969 | Finn et al. | 501/68 |

*Primary Examiner*—Mark L. Bell
*Attorney, Agent, or Firm*—Clinton S. Janes, Jr.

[57] ABSTRACT

There is disclosed a family of low dielectric, copper-exuding, boroaluminosilicate glasses particularly adapted to use in forming substrates for electronic devices such as integrated circuits. The glasses are capable of exuding copper oxide, have a coefficient of thermal expansion of $30-35 \times 10^{-7}$ at 300° C., a dielectric constant not over 5.0 at 100 KHz, a loss tangent not over 0.003 at 100 KHz and consist essentially, in percent by weight, of 56-64% $SiO_2$, 18-25% $B_2O_3$, 3-11% $Al_2O_3$, 0-2% CaO, 0-2% $Li_2O$, 0-1% $K_2O$, the $Li_2O+CaO$ being 1.5-3% and 1-20% CuO.

4 Claims, No Drawings

COPPER-EXUDING, BOROALUMINOSILICATE GLASSES

RELATED APPLICATION

An application Ser. No. 105,263 filed on 10-7-87 herewith in the names of E. A. Boylan and G. D. Fong, and entitled "Thermal Writing on Glass and Glass-Ceramic Substrates", discloses and claims a method of producing a pattern of a transition metal on a glass or glass-ceramic substrate by applying an intense, well-focused source of energy along a path on the substrate that corresponds to the pattern, the glass being one that contains a substantial amount of the oxide of the transition metal, and that is capable of exuding the metal under thermal influence. It further discloses and claims the article produced which may, for example, be microcircuitry. A preferred source of energy is a laser beam with the glass being capable of absorbing the optical energy and converting it to thermal energy.

INTRODUCTION

This invention is concerned with low dielectric, boroaluminosilicate glasses that exude copper oxide upon heat treatment. It is particularly concerned with such glasses that have coefficients of thermal expansion that permit serving as a substrate for silicon chips in integrated circuits.

It is known that silicon has a coefficient of thermal expansion about $32 \times 10^{-7}$ at 300° C. Accordingly, glasses compatible with silicon should have coefficients of about 30-35. In addition, the glasses must have special characteristics to be advantageously used in production of high frequency circuits. These characteristics include a dielectric constant not over 5.0 and loss tangents not over 0.003 as measured in frequency domains of interest. Finally, it would be desirable to provide electroconductive metal patterns on selected portions of the glass surface to serve as contacts, interconnections and the like.

PURPOSES OF THE INVENTION

A basic purpose is to provide a family of copper-containing, low dielectric, boroaluminosilicate glasses capable of exuding copper when thermally excited.

Another purpose is to provide such glasses having coefficients of thermal expansion in the range of $30-35 \times 10^{-7}$ at 300° C.

A further purpose is to provide such glasses having a dielectric constant not over 5.0 and loss tangents not over 0.003 at 100 kilohertz (KHz).

A still further purpose is to provide an integrated circuit comprising a silicon element and a substrate formed from a low dielectric, boroaluminosilicate glass capable of exuding copper under thermal excitement.

Still another purpose is to produce electronic devices having leads interconnected by very fine, electroconductive, metal lines.

A further purpose is to produce a metal pattern on a glass or glass-ceramic surface by a simple thermal treatment.

Another purpose is to produce metal circuit lines less than 2 mils (50 microns) in width.

SUMMARY OF THE INVENTION

One aspect of our invention is a family of low dielectric, copper-exuding, boroaluminosilicate glasses consisting essentially of, in percent by weight on the oxide basis, 56-64% $SiO_2$, 18-25% $B_2O_3$, 3-11% $Al_2O_3$, 0-2% CaO, 0-2% $Li_2O$, 0-1% $K_2O$, total $Li_2O+K_2O+CaO$ is 1.5-3%, and 1-20% CuO, and having a coefficient of thermal expansion of $30-35 \times 10^{-7}$ at 300° C., a dielectric constant not over 5.0 at 100 KHz, and a loss tangent not over 0.003 at 100 KHz.

In another form, the invention is an electronic device comprising a silicon element and a substrate for the element formed from a low dielectric, copper-exuding, boroaluminosilicate glass consisting essentially of, in percent by weight on the oxide basis, 56-64% $SiO_2$, 18-25% $B_2O_3$, 3-11% $Al_2O_3$, 0-2% CaO, 0-2% $Li_2O$, 0-1% $K_2O$, total $Li_2O+K_2O+CaO$ is 1.5-3%, and 1-20% CuO, and having a coefficient of thermal expansion of $30-35 \times 10^{-7}$ at 300° C., a dielectric constant not over 5.0 at 100 KHz, and a loss tangent not over 0.003 at 100 KHz.

Prior Literature

U.S. Pat. No. 3,420,645 (Hair) discloses a method of making a hollow glass article having a metallic copper coating. Solid particles of a $CuO - Al_2O_3 - SiO_2$ glass are heated in a hydrogen-containing atmosphere to expand the particles and cause metallic copper to form on their surfaces.

U.S. Pat. No. 3,464,806 (Seki et al.) and British Patent No. 944,571 (McMillan et al.) describe producing a copper or silver metallized glass-ceramic by including a nucleating agent and copper or silver oxide in a cerammable glass, and heating the glass on a controlled cycle in a reducing atmosphere.

U.S. Pat. No. 3,490,887 (Herczog et al.) discloses outward migration of copper ions in a ferroelectric glass-ceramic by controlled heat treatment. The copper ions oxidize at the surface to form an oxide layer that can be reduced to metallic copper by firing in hydrogen.

U.S. Pat. No. 3,528,829 (Baak et al.) discloses glasses in the $Cu_2O-Al_2O_3-SiO_2$ system having coefficients of thermal expansion about $10 \times 10^{-7}$.

Kamiya et al., *Journal of Non-Crystalline Solids*, 80 (1986) 405-411, describe studies on the behavior of copper ions in $CuO - Al_2O_3 - SiO_2$ glasses heated in air.

GENERAL DESCRIPTION

The invention arose from a search for low dielectric glasses that are capable of exuding copper on a surface when heat treated. The dielectric requirements are a dielectric constant not over 5.0 when measured at 100 KHz, and a loss tangent not over 0.003 when measured at 100 KHz.

It is recognized that measurement of dielectric properties may be specified at much higher frequency values for some applications. However, it has proven convenient to make measurements at 100 KHz. Furthermore, such measurements are deemed adequate, since literature reports indiate that both dielectric constant and loss tangent decrease to minimum values as the frequency of measurement is increased.

The search was further limited by the need for a glass coefficient of thermal expansion between about 30 and $35 \times 10^{-7}$ at 300° C. This was necessary to permit forming a seal with silicon in an electronic device, specifically an integrated circuit.

It was recognized that at least some borosilicates and aluminosilicates were known to be capable of exuding copper oxide under influence of heat. Likewise, both types of glass tend to have low coefficients of thermal expansion. However, glasses otherwise satisfactory generally failed to provide dielectric properties within limits. For example, one series of borosilicates containing small amounts of alumina had dielectric constants between 5.0 and 6.0 and loss tangents ranging from 0.004 to 0.014.

A known low dielectric borosilicate is composed of 70.0% $SiO_2$, 28.2% $B_2O_3$, 1.2% $Li_2O$ and 0.6% $K_2O$. The addition of CuO, in amounts up to 10% by weight, to this composition, had little effect on the low dielectric characteristics. However, the glasses failed to exude copper oxide when heat treated.

Further studies revealed that a content of at least three (3) weight percent of alumina was required to render the glasses capable of exuding copper. However, in the absence of lithia ($Li_2O$), it has been found necessary to employ at least five (5) weight percent alumina to permit copper exudation. Alumina tends to raise the dielectric values and harden the glass. Accordingly, the alumina content should not exceed about 11% by weight.

As just observed, the presence of lithia is desirable to facilitate copper exudation. However, increasing amounts of lithia tend to increase the dielectric constant, thus restricting the lithia content to not over about four mole percent (about two wt. %).

CaO may replace $K_2O$ and partially replace the $Li_2O$ in a glass. It tends to increase the dielectric constant and decrease the expansion coefficient. Therefore, if present, this oxide must be restricted.

At least about one wt. % copper oxide is required for exudation and up to about 20% may be permissible. However, for some purposes, it is desirable to limit the content of copper oxide to not over ten weight percent, since larger amounts tend to increase the dielectric constant.

SPECIFIC DESCRIPTION

TABLE I sets forth compositions for several exemplary glasses within the scope of our invention. These compositions are calculated on the oxide basis from the glass batch, and are given in parts by weight. Since the total approximates 100 in each case, the compositions may be taken as if in percent by weight.

The table further sets forth a number of property measurements made on glasses having the indicated compositions. The dielectric constant (K) was measured at 100 KHz; the loss tangent (LT) at 2.5 GHz for Examples 1–4, and at 100 KHz for Examples 5 and 6; the coefficient of thermal expansion ($CTE \times 10^{-7}$) at 300° C. The surface resistance of thermally exuded copper, as measured on each Example, was uniformly low (less than 5 ohm-cm).

TABLE I

|  | 1 | 2 | 3 | 4 | 5 | 6 |
|---|---|---|---|---|---|---|
| $SiO_2$ | 63.7 | 62.8 | 60.8 | 59.7 | 62.6 | 60.6 |
| $B_2O_3$ | 22.8 | 20.6 | 19.8 | 18.1 | 20.6 | 19.9 |
| $Al_2O_3$ | 5.0 | 8.2 | 8.1 | 11.1 | 8.2 | 7.9 |
| $Li_2O$ | 1.1 | 1.1 | 1.1 | 1.1 | 0.8 | 1.1 |
| CuO | 6.8 | 6.7 | 9.7 | 9.5 | 6.7 | 6.5 |
| $K_2O$ | 0.6 | 0.6 | 0.6 | 0.5 | 0.6 | 0.6 |
| CaO | — | — | — | — | 0.5 | — |
| $Fe_2O_3$ | — | — | — | — | — | 3.5 |
| K | 4.47 | 4.63 | 4.75 | 4.87 | 4.90 | 4.48 |
| LT | 0.0015 | 0.0020 | 0.0020 | 0.0020 | 0.0010 | 0.0020 |
| C.T.E. | 32.8 | 34.5 | 34.8 | 30.5 | 31.3 | — |

Glass batches corresponding to each of the compositions in TABLE I were mixed, melted and poured into molds, or rolled into ⅛" (3 mm) patties, for measurement of properties. The batches were melted in silica crucibles for six hours at 1600° C. Standard commercial raw materials were employed.

The glass test pieces were fired in air for six hours at 550° C., then examined for exudation of copper oxide as a dull gray surface coating. If none was observed, a sample was successively fired at 50° C. intervals up to 750° C. If exudation had not occurred by 750° C., the glass was rejected, since higher temperatures would tend to soften and distort the glass.

If a sample did exude copper oxide, it was then heated in a hydrogen atmosphere for 2 to 4 hours at 320° C., after first purging the furnace with nitrogen. The samples were cooled to 100° C. in hydrogen, and then exposed to nitrogen for cooling to ambient and purging of the hydrogen.

Discs two inches in diameter were then ground and polished, and painted with a silver paint for dielectric measurements.

TABLE II sets forth compositions of several boroaluminosilicates and borosilicates that are related to the glasses of the invention, but do not provide the desired properties. These glass compositions are calculated in the manner described for those of TABLE I. Also, glasses were prepared, and properties measured, in the same manner as described with reference to TABLE I, except that loss tangent was measured at 100 KHz on all samples.

TABLE II

|  | 7 | 8 | 9 | 10 |
|---|---|---|---|---|
| $SiO_2$ | 72.8 | 66.4 | 59.7 | 63.0 |
| $B_2O_3$ | 11.3 | 26.8 | 17.7 | 24.5 |
| $Al_2O_3$ | 6.2 | — | 11.2 | — |
| $Li_2O$ | — | 1.2 | 0.5 | 1.1 |
| $Na_2O$ | 3.6 | — | — | — |
| $K_2O$ | — | 0.6 | 0.5 | 0.6 |
| CuO | 6.1 | 5.0 | 9.5 | 6.8 |
| CaO | — | — | 1.0 | — |
| $Fe_2O_3$ | — | — | — | 3.6 |
| Cl | — | — | — | 0.4 |
| K | 5.70 | 4.41 | 5.11 | 4.51 |
| LT | 0.014 | <0.001 | 0.003 | 0.006 |
| CTE | — | — | 28.1 | — |

The glass of Example 7, after heat treatment at 550° C., 650° C. and 770° C. failed to exude at any of the three temperatures. Likewise, the glass of Example 8 was heat treated at 450° C. and 700° C. and failed to exude at either temperature.

Example 9 illustrates the fact that CaO substitution for $Li_2O$ reduces the coefficient of thermal expansion markedly. While this can be beneficial, it must be used with caution. The glass of Example 10 exuded only slightly with heat treatment, and was non-conducting after hydrogen reduction.

The invention has thus far been described with reference to film formation of copper on glass samples. That is, of course, a useful application of the glasses, as well as being a convenient method of determining exudation characteristics in successive series of glass melts. However, a particular utility of our glasses is for thermal writing as disclosed in the companion application noted earlier as a related application.

As an example of that preferred aspect of the invention, metallic copper lines were produced directly on an optically flat glass substrate, that is, without hydrogen reduction. The composition of the glass substrate was that of Example 2 in TABLE I.

The substrate was rastered beneath an argon laser beam of 514 nm. wavelength operating at one watt power. Copper lines were formed with the beam traveling at different rates. These lines varied in width from 5-50 microns (0.2-2 mils), depending on the travel rate, and were a few tenths of a micron in depth.

The copper lines, as formed, were not electroconductive. It is thought this is caused by the rapid dendritic growth character of the copper during exposure to the laser beam. However, when the substrate was dipped in an electroless plating solution for a few minutes, the lines showed resistance values of 5-100 ohm-cm. while retaining their fine resolution.

While working with an argon laser, it is frequently desirable, although not a necessity, to include up to about 5% $Fe_2O_3$ in the glass composition. This assists in absorbing the optical energy and converting it to thermal energy.

We claim:

1. A family of low dielectric, copper-exuding, boroaluminosilicate glasses consisting essentially of, in percent by weight on the oxide basis, 56-64% $SiO_2$, 18-25% $B_2O_3$, 3-11% $Al_2O_3$, 0-2% CaO, 0-2% $Li_2O$, 0-1% $K_2O$, the total $Li_2O+K_2O+CaO$ being 1.5-3%, and 1-20% CuO, and having a coefficient of thermal expansion of $30-35\times10^{-7}$ at 300° C., a dielectric constant not over 5.0 at 100 KHz, and a loss tangent not over 0.003 at 100 KHz.

2. A family of glasses in accordance with claim 1 wherein the CuO content is not over 10%.

3. A family of glasses in accordance with claim 1 wherein the composition additionally contains up to 5% $Fe_2O_3$.

4. A glass in accordance with claim 1 consisting of, in percent by weight on the oxide basis, 62.8% $SiO_2$, 20.6% $B_2O_3$, 8.2% $Al_2O_3$, 1.1% $Li_2O$, 6.8% CuO and 0.6% $K_2O$.

* * * * *